(12) United States Patent
Onishi

(10) Patent No.: US 7,402,447 B2
(45) Date of Patent: Jul. 22, 2008

(54) SEMICONDUCTOR LASER DEVICE AND METHOD FOR FABRICATING THE SAME

(75) Inventor: Toshikazu Onishi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 79 days.

(21) Appl. No.: 11/346,373

(22) Filed: Feb. 3, 2006

(65) Prior Publication Data

US 2006/0128046 A1   Jun. 15, 2006

Related U.S. Application Data

(62) Division of application No. 10/205,227, filed on Jul. 26, 2002.

(30) Foreign Application Priority Data

Jul. 26, 2001   (JP) ............................. 2001-225844

(51) Int. Cl.
*H01L 21/00*   (2006.01)
(52) U.S. Cl. .................. 438/47; 257/E33.054
(58) Field of Classification Search .................. 438/31, 438/47; 257/E25.028, E25.032, E33.054
See application file for complete search history.

(56) References Cited

U.S. PATENT DOCUMENTS

| 5,212,705 | A | | 5/1993 | Kahen et al. |
| 5,332,918 | A | | 7/1994 | Smith et al. |
| 5,684,360 | A | | 11/1997 | Baum et al. |
| 5,737,351 | A | | 4/1998 | Ono |
| 5,811,839 | A | | 9/1998 | Shimoyama et al. |
| 5,821,569 | A | | 10/1998 | Dutta |
| 5,822,348 | A | * | 10/1998 | Fujii ........................ 372/45.01 |
| 5,835,516 | A | * | 11/1998 | Miyashita et al. ........ 372/46.01 |
| 6,014,400 | A | | 1/2000 | Kobayashi |
| 6,081,541 | A | * | 6/2000 | Adachi et al. .............. 372/50.1 |
| 6,278,137 | B1 | | 8/2001 | Shimoyama et al. |
| 2003/0025123 | A1 | | 2/2003 | Onishi |

FOREIGN PATENT DOCUMENTS

| EP | 1 024 566 A2 | 2/2000 |
| JP | 62-076792 | 4/1987 |

(Continued)

OTHER PUBLICATIONS

"Notice of Reasons for Rejections" No. 2002-210802 dated Mar. 22, 2006 from the Japanese Patent Office. (with Translation).

(Continued)

*Primary Examiner*—Lex Malsawma
(74) *Attorney, Agent, or Firm*—Nixon Peabody LLP; Jeffrey L. Costellia

(57) ABSTRACT

A semiconductor laser device according to the present invention has a semiconductor substrate, an active layer formed on the semiconductor substrate and made of a compound semiconductor containing phosphorus, a guide layer formed on the active layer and made of a compound semiconductor a dopant diffusion preventing layer formed on the guide layer and made of a semiconductor compound containing arsenic, and a clad layer formed on the dopant diffusion preventing layer and made of a compound semiconductor containing a dopant.

3 Claims, 12 Drawing Sheets

FOREIGN PATENT DOCUMENTS

| | | |
|---|---|---|
| JP | 01-194379 | 8/1989 |
| JP | 04042986 | 2/1992 |
| JP | 06237038 | 8/1994 |
| JP | 07-245447 | 9/1995 |
| JP | 09139550 | 5/1997 |
| JP | 09275241 | 10/1997 |
| JP | 10-290043 A | 10/1998 |
| JP | 10290049 | 10/1998 |
| JP | 11-054837 | 2/1999 |
| JP | 11-284280 A | 10/1999 |
| JP | 2000-286507 A | 10/2000 |
| JP | 2003-110200 | 4/2003 |

OTHER PUBLICATIONS

English Language translation of Notice of Reasons for Rejection for Japanese Patent Application No. 2006-202085, dated Jul. 10, 2007.

* cited by examiner

SEMICONDUCTOR LASER DEVICE AND METHOD FOR FABRICATING THE SAME

BACKGROUND OF THE INVENTION

The present invention relates to a semiconductor laser device and to a method for fabricating the same. More particularly, it relates to an increase in the output of the semiconductor laser device.

Recent years have seen rapid widespread use of DVD (Digital Versatile Disk) devices in the fields of AV (Audio-Video) equipment, PCs (Personal Computers), and the like. In particular, great expectations have been placed on the use of recordable DVD devices (such as DVD-RAM and DVD-R) as large-capacity memory devices embedded in PCs and the like and as post-VTR (Video Tape Recorder) devices.

As pickup light sources for the foregoing DVD devices, red semiconductor lasers at wavelengths in the 650 nm band have been used. With the recent increases in the density and capacity of an optical disk, a pick-up light source capable of performing a particularly high output operation over 80 mW has been in growing demand to allow a higher-speed write operation with respect to the optical disk.

If a semiconductor laser device is increased in output, however, the problem is encountered that the output thereof is saturated. The problem is conspicuous when the semiconductor laser device is operating at a high temperature. This is because an AlGaInP-based material composing the p-type clad layer of the red laser has a limitation in that it cannot provide a sufficiently large band barrier against electrons in the conduction band. Under high-temperature and high-output operating conditions, therefore, overflowing electrons are increased and a component of an injected current which does not contribute to light emission is increased.

In suppressing the overflow of electrons, it is effective to increase the concentration of a p-type impurity in the p-type clad layer and enlarge the band barrier against the electrons. i.e. accomplish high-concentration doping of the p-type clad layer with a p-type impurity.

However, the influence of solid-phase diffusion cannot be ignored in the AlGaInP-based material because of the diffusion coefficient of the p-type impurity which is generally high therein. It has been reported that the diffusion coefficient of Zn, e.g., in an AlGaInP-based material is $1 \times 10^{-13}$ to $6 \times 10^{-13}$ cm$^2$s$^{-1}$, which is about two orders of magnitude higher than that of Zn in an AlGaAs material used for the infrared laser. The influence of solid-phase diffusion becomes more conspicuous in the case of high-concentration doping since the diffusion coefficient of the impurity is directly proportional to the square of a doping concentration.

FIG. 3 shows a SIMS profile of an active layer and a clad layer in a conventional semiconductor laser device. As shown in FIG. 3, Zn has been mixed in the active layer though it has not been doped with an impurity intentionally. This results from the diffusion of an impurity used to dope the p-type clad layer in the active layer during the processes of crystal growth, thermal treatment, and the like for fabricating the semiconductor laser device. Similar impurity diffusion also occurs during the operation of the semiconductor laser device. If the impurity is diffused in the active layer, a non-radiative recombination center may be formed to degrade the characteristics of the semiconductor laser device. The production of a crystal defect reduces the lifespan of the semiconductor laser.

Due to the impurity diffusion in the active layer described above, the doping of the p-type clad layer with the p-type impurity at a high concentration has been difficult.

As a method for suppressing impurity diffusion in the active layer, therefore, Japanese Unexamined Patent Publication No. 2000-286507 discloses one which provides an undoped spacer layer between the p-type clad layer and an optical guide layer such that an impurity is absorbed in the spacer layer. If the doping concentration of the p-type clad layer of an AlGaInP-based semiconductor laser device is to be increased by using the method, the spacer layer for suppressing impurity diffusion should have a sufficiently large thickness. As the thickness of the spacer layer is increased, however, a series resistance is increased so that an operating current is increased disadvantageously or it becomes difficult to obtain a desired beam configuration under the influence of the spacer layer.

SUMMARY OF THE INVENTION

The present invention has been achieved to solve the foregoing problems and it is therefore an object of the present invention to provide a semiconductor laser device capable of performing a high-output operation at a high temperature with high reliability.

A semiconductor laser device according to the present invention comprises: a semiconductor substrate; an active layer formed on the semiconductor substrate and made of a compound semiconductor containing phosphorus; a guide layer formed on the active layer and made of a compound semiconductor; a dopant diffusion preventing layer formed on the guide layer and made of a compound semiconductor containing arsenic; and a clad layer formed on the dopant diffusion preventing layer and made of a compound semiconductor containing a dopant.

By disposing the dopant diffusion preventing layer containing arsenic between the clad layer and the active layer, the diffusion of the dopant from the clad layer to the active layer can be suppressed or prevented. This allows the provision of the clad layer into which the dopant has been implanted at a high concentration. By further disposing the guide layer between the dopant diffusion preventing layer and the active layer, interdiffusion of phosphorus contained in the active layer and arsenic contained in the dopant diffusion preventing layer can be suppressed or prevented. This provides a semiconductor laser device capable of performing a high-output operation at a high temperature with high-reliability.

Preferably, a concentration of the dopant in the clad layer is in a range of $5 \times 10^{17}$ atoms cm$^{-3}$ to $1 \times 10^{19}$ atoms cm$^{-3}$.

The arrangement suppresses the overflow of electrons and provides a red semiconductor laser device capable of performing a high-output operation at a high temperature.

Since the diffusion of the dopant from the clad layer to the active layer is suppressed or prevented, the clad layer into which the dopant has been implanted at a high concentration can be provided. This provides a semiconductor laser device containing a dopant at a concentration exactly as designed.

If the dopant is zinc the present invention achieves a particularly high effect of suppressing or preventing the diffusion of the dopant from the clad layer to the active layer.

Preferably, a thickness of the guide layer is in a range of 10 nm to 50 nm.

Preferably, a thickness of the dopant diffusion preventing layer is 2 nm or more.

A thickness of the dopant diffusion preventing layer may be 50 nm or less.

The semiconductor substrate may be made of GaAs, the active layer may be made of $(Al_xGa_{1-x})_{1-y}In_yP$ ($0 \leq x \leq 1$, $0 \leq y \leq 1$), and the dopant diffusion preventing layer may be made of $Al_zGa_{1-z}As$ ($0 \leq z \leq 1$).

Preferably, the dopant diffusion preventing layer includes a layer made of $Al_wGa_{1-w}As$ ($0 \leq w \leq 1$) and a layer made of GaAs which are alternately deposited.

The interfaces between the layers made of $Al_wGa_{1-w}As$ ($0 \leq w \leq 1$) and the layers made of GaAs form heterojunction interfaces. The formation of the structure in which the heterojunction interfaces are repeatedly observed enhances the effect of suppressing the diffusion of the dopant.

Preferably, the compound semiconductor making the dopant diffusion preventing layer further contains carbon, beryllium, or magnesium.

The arrangement allows the dopant diffusion preventing layer to have p-type conductivity. Accordingly, the electric resistance of the dopant diffusion preventing layer is reduced and the power consumption of the semiconductor laser device can be reduced thereby.

Preferably, the compound semiconductor making the dopant diffusion preventing layer further contains silicon or selenium.

This further enhances the effect of suppressing or preventing the diffusion of the dopant from the clad layer to the active layer.

Preferably, the active layer has a first region including two types of layers made of compound semiconductors with different band gaps and alternately deposited and a second region made of alloyed compound semiconductors with different band gaps and adjacent to the first region.

The first region of the active layer has a multiple quantum well structure including the two types of layers made of the compound semiconductors with the different band gaps and alternately deposited. The second region of the active layer has a single quantum well structure made of the alloyed semiconductor compound semiconductors with the different band gaps which are different from those of the compound semiconductors making the two types of layers included in the first region. Consequently, a beam emitted from the first region is hardly absorbed while passing through the second region of the active region in which the band gap corresponding to the energy of the beam does not exist. What results is a semiconductor laser device in which the degradation of the beam is suppressed.

A method for fabricating a semiconductor laser device according to the present invention comprises the steps of: (a) successively depositing, on a semiconductor substrate, an active layer made of a compound semiconductor containing phosphorus and a guide layer made of a compound semiconductor; (b) depositing, on the substrate, a dopant diffusion preventing layer made of a compound semiconductor containing arsenic; and (c) depositing, on the substrate, a first clad layer made of a compound semiconductor containing a dopant.

The method for fabricating a semiconductor laser device according to the present invention can suppress or prevent the diffusion of the dopant from the clad layer to the active layer by disposing the dopant diffusion preventing layer containing, arsenic between the clad layer and the active layer. This allows high-concentration doping of the clad layer with the dopant. By further disposing the guide layer between the dopant diffusion preventing layer and the active layer, interdiffusion of phosphorus contained in the active layer and arsenic contained in the dopant diffusion preventing layer can be suppressed or prevented. This provides a semiconductor laser device capable of performing a high-output operation at a high temperature with high reliability.

The method may further comprise the steps of: (d) after the step (c), depositing, on the substrate, a current block layer made of a compound semiconductor; (e) forming an opening configured as a stripe in the current block layer; and (f) depositing, on the substrate, a second clad layer made of a compound semiconductor containing a dopant.

The method may further comprise the steps of: (d) after the step (c), successively depositing, on the substrate, an etching stop layer, a second clad layer made of a compound semiconductor containing a dopant, and a cap layer; (g) forming, on the cap layer, a mask having an opening; (h) removing, by using the mask, respective regions of the second clad layer and the cap layer located within the opening to expose the etching stop layer in the opening; and (i) forming, on the substrate, a current block layer made of a compound semiconductor.

The method may further comprise the steps of: (k) after the step (c), forming, on the substrate, a first mask having a first opening; (l) forming, by using the first mask, a first region from which the respective regions of the dopant diffusion preventing layer and the first clad layer located within the first opening have been removed and a second region in which the dopant diffusion preventing layer and the first clad layer are deposited; (m) depositing, on the substrate, the first clad layer again and further successively depositing an etching stop layer, a second clad layer made of a compound semiconductor containing a dopant, and a cap layer; (n) forming a mask for dopant diffusion on the second region of the substrate and performing a thermal treatment; (o) removing the mask for dopant diffusion and then forming a second mask having an opening extending crosswise over the first and second regions of the substrate; (p) removing, by using the second mask, the regions of the second clad layer and the cap layer located within the second opening to expose the etching stop layer in the second opening; and (q) forming, on the substrate, a current block layer made of a compound semiconductor.

DETAILED DESCRIPTION OF THE INVENTION

Figure 1:
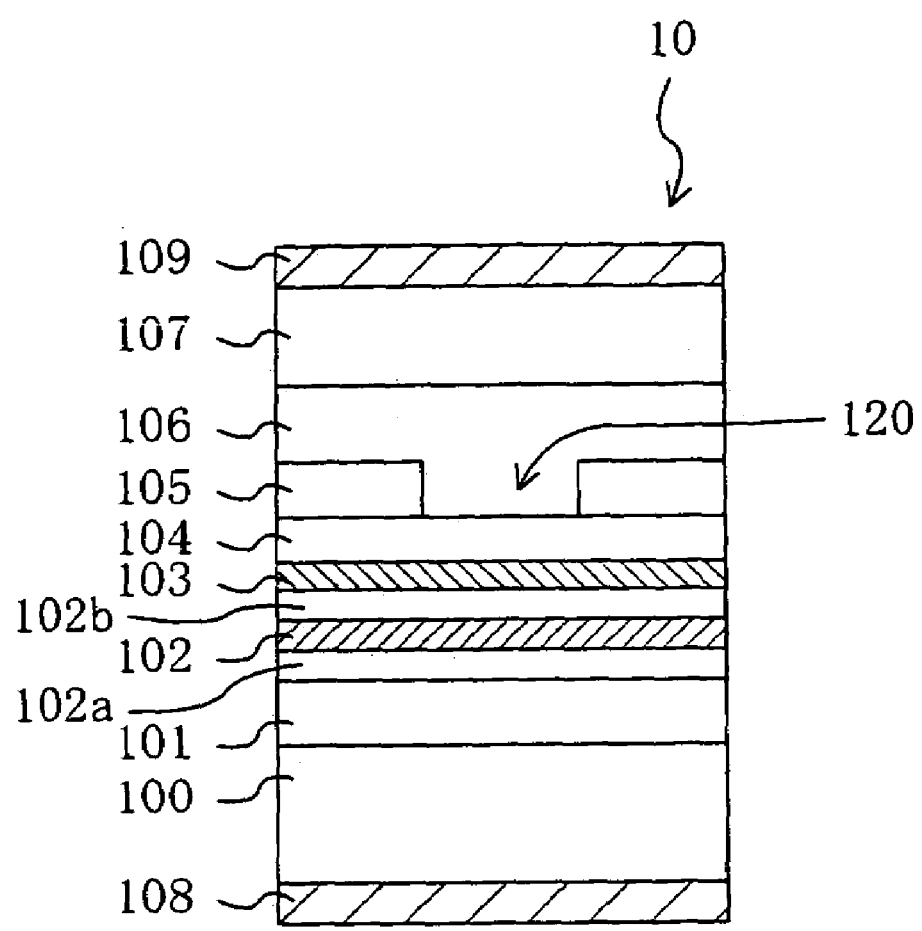
FIG. 1 is a cross-sectional view of a semiconductor laser device according to EMBODIMENT 1 of the present invention.

Referring to FIGS. 1 to 11, the embodiments of the present invention will be described herein below. For the sake of simplicity, components common to the individual embodiments are designated by the same reference numerals.

Embodiment 1

FIG. 1 is a cross-sectional view of a semiconductor laser-device according to EMBODIMENT 1 of the present invention.

As shown in FIG. 1, a semiconductor laser device 10 according to the present embodiment has a multilayer structure composed of: an n-type clad layer 101 made of n-type AlGaInP; a guide layer 102a (with a thickness of 30 nm) made of AlGaInP; an active layer 102 composed of a quantum well consisting of a plurality of GaInP layers and a plurality of AlGaInP layers; a guide layer 102b (with a thickness of 30 nm) made of AlGaInP; a diffusion preventing layer 103 made of AlGaAs; a first p-type clad layer 104 made of p-type AlGaInP; a current block layer 105 made of n-type AlGaInP; a second p-type clad layer 106 made of p-type AlGaInP; and a contact layer 107 made of p-type GaAs, which are stacked successively on a substrate 100 made of n-type GaAs.

In the present embodiment, the active layer 102 is composed of a repetition of the structure in which the GaInP layers are sandwiched between the AlGaInP layers.

An n-side electrode 108 made of a metal (such as an alloy of Au, Ge, or Ni) making an ohmic contact with the n-type GaAs substrate 100 is formed on the lower surface of the n-type GaAs substrate 100. A p-side electrode 109 made of a metal (such as an alloy of Cr, Pt, or Au) making an ohmic contact with the contact layer 107 is formed on the upper surface of the contact layer 107.

The current block layer 105 is formed with an opening 120 configured as a stripe extending in a direction perpendicular to the paper plane to reach the first p-type clad layer 104. Through the opening 120, the first and second p-type clad layers 104 and 106 are in contact with each other. A current is injected through the opening 120 into the active layer 102 to cause laser oscillation.

In the present embodiment, AlGaInP represents $(Al_xGa_{1-x})_{1-y}In_yP$ ($0 \leq x \leq 1$, $0 \leq y \leq 1$) and GaInP represents a compound semiconductor obtained when x=0 is satisfied in $(Al_xGa_{1-x})_{1-y}In_yP$, while AlGaAs represents $Al_zGa_{1-z}As$ ($0 \leq z \leq 1$).

Table 1 shows the respective thicknesses, impurity concentrations, and Al composition ratios of the individual layers of the semiconductor laser device 10 according to the present embodiment.

TABLE 1

| Layer | Thickness | Impurity Concentration (atoms cm$^{-3}$) | Al Composition Ratio x |
|---|---|---|---|
| n-Type Clad Layer 101 | 1.5 μm | $1 \times 10^{18}$ | 0.7 |
| Guide Layer 102a | 30 nm | Undoped | 0.5 |
| Active Layer 102 | | | |
| GaInP Layers (3 in Total) | 6 nm | Undoped | 0 |
| AlGaInP Layers (2 in Total) | 6 nm | Undoped | 0.5 |
| Guide Layer 102b | 30 nm | Undoped | 0.5 |
| Diffusion Preventing Layer 103 | 30 nm | Undoped | 0.85 |
| First p-Type Clad Layer 104 | 0.2 μm | $1 \times 10^{18}$ | 0.7 |
| Current Block Layer 105 | 0.3 μm | $1 \times 10^{18}$ | 1.0 |
| Second p-Type Clad Layer 106 | 1.5 μm | $1 \times 10^{18}$ | 0.7 |
| Contact Layer 107 | 2.0 μm | $2 \times 10^{18}$ | GaAs |

In the present embodiment, y representing the composition ratio of In has a value of about 0.5 in each of the n-type clad layer 101, the guide layer 102a, the active layer 102, the guide layer 102b, the first p-type clad layer 104, the current block layer 105, and the second p-type clad layer 106 each made of a material represented by $(Al_xGa_{1-x})_{1-y}In_yP$. To achieve lattice matching with the n-type GaAs substrate 100, the value of y representing the In composition ratio is preferably in the range of $0.45 \leq y \leq 0.55$. It will easily be appreciated that, if another substrate is used, the value of y may be varied appropriately depending on the substrate and the value of y is not limited to the foregoing range.

Figure 2A:
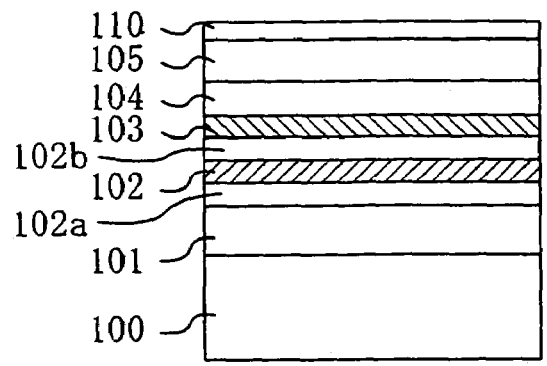
FIGS. 2A to 2C diagrammatically show the cross-sectional structures of the semiconductor laser device according to EMBODIMENT 1 in the individual steps of a fabrication process therefor.
Figure 2B:
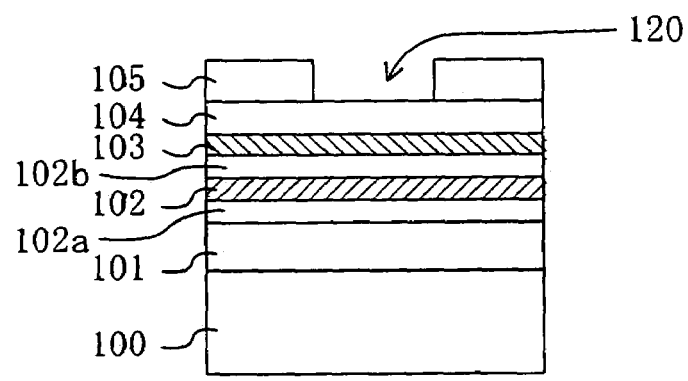
Figure 2C:
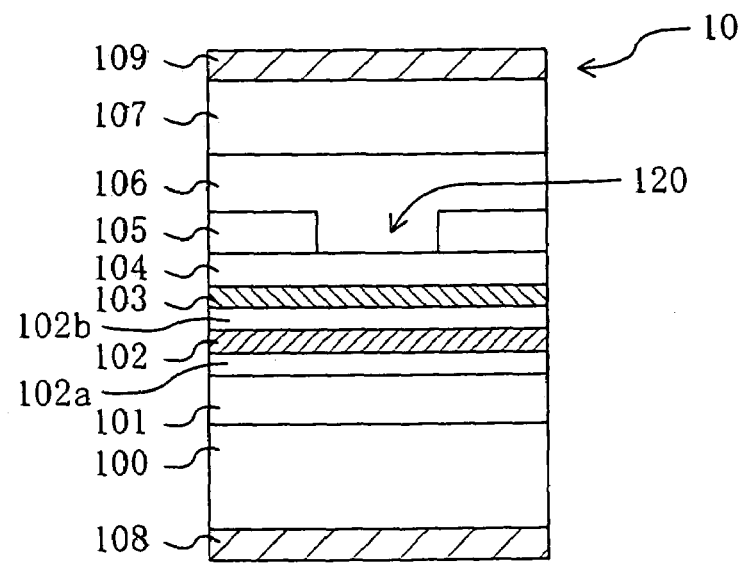

A description will be given to a method for fabricating the semiconductor laser device with reference to FIGS. 2A to 2C. FIGS. 2A to 2C diagrammatically show the cross-sectional structures of the semiconductor laser device according to the present embodiment in the individual-steps of a fabrication process therefor.

First, in the step shown in FIG. 2A, the substrate 100 made of n-type GaAs is prepared. Then, the n-type clad layer 101 made of n-type AlGaInP, the guide layer 102a made of AlGaInP, the active layer 102, the guide layer 102b made of AlGaInP, the diffusion preventing layer 103 made of AlGaAs, the first p-type clad layer 104 made of p-type AlGaInP, the current block layer 105 made of n-type AlGaInP, and a cap layer 110 made of GaAs are deposited successively by, e.g., MOCVD, MBE, or the like on the substrate 100. The active layer 102 is formed by alternately depositing the GaInP layers and the AlGaInP layers.

In forming the first p-type clad layer 104 made of p-type AlGaInP in the foregoing step, Zn is introduced as a p-type dopant. The introduction of Zn is effected by using a method well known to those skilled in the art, such as one which mixes $Zn(CH_3)_2$ in a raw material gas and forms an AlGaInP layer by crystal growth, one which forms an undoped AlGaInP layer and introduces Zn by ion implantation, or one which forms an undoped AlGaInP layer by crystal growth and uses ZnO as a solid-phase diffusion source to introduce Zn by solid-phase diffusion.

Next, in the step shown in FIG. 2B, a resist film is patterned by photolithography into a stripe extending in a direction perpendicular to the paper plane and the current block layer 105 is etched by using the resist film as a mask so that the openings 120 each configured as the stripe extending in a direction perpendicular to the paper plane is formed in the current block layer 105.

Subsequently, in the step shown in FIG. 2C, the second p-type clad layer 106 made of p-type AlGaInP and the contact layer 107 made of p-type GaAs are deposited successively by, e.g., MOCVD, MBE, or the like on the substrate obtained in the previous step. Then, the p-side electrode 109 is formed by electron beam vapor deposition or the like on the contact layer 107. Likewise, the n-side electrode 108 is also formed by electron beam vapor deposition or the like on the substrate 100. In forming the second p-type clad layer 106 and the contact layer 107 made of p-type GaAs, Zn is introduced as a p-type impurity. The introduction of Zn is effected by the same method as used in forming the first p-type clad layer 104 in the step shown in FIG. 2A, which is well known to those skilled in the art.

A description will be given next to the operation of the semiconductor laser device 10 according to the present embodiment.

If a voltage is applied between the n-side electrode 108 and the p-side electrode 109 such that a current is injected to flow therebetween, the injected current is confined by the current block layer 105 in the second p-type clad layer 106 so that a laser beam at an oscillating wavelength of 650 nm is emitted from the active layer 102.

When the semiconductor laser device 10 according to the present embodiment thus obtained was operated, an output of 100 mW was obtained without the occurrence of thermal saturation even at an ambient temperature of 70° C.

In the semiconductor laser device 10 according to the present embodiment, the diffusion preventing layer 103 is disposed between the guide layer 102b and the first p-type clad layer 104. This suppresses or prevents the diffusion of a p-type impurity (which is Zn in the present embodiment) from the first p-type clad layer 104 to the active layer 102 during the deposition of each of the first p-type clad layer 104, the current block layer 105, and the cap layer 110.

In general, the diffusion coefficient of a p-type impurity in an AlGaAs-based material is lower than that of the impurity in an AlGaInP-based material. If the impurity is Zn, e.g., the diffusion coefficient thereof in the AlGaAs-based material is about two orders of magnitude lower than that in the AlGaInP material. By disposing the diffusion preventing layer 103 made of AlGaAs between the first p-type clad layer 104 and the guide layer 102b, therefore, the diffusion of the impurity can be suppressed or prevented effectively.

It will easily be appreciated that the diffusion of an impurity from each of the first p-type clad layer 104, the second p-type clad layer 106, and the contact layer 107 to the active layer 102 can also be suppressed or prevented during the deposition of each of the second p-type clad layer 106 and the contact layer 107.

A specific description will be given herein below to the effect of suppressing the diffusion of an impurity into the active layer 102 achieved in the semiconductor laser device 10 according to the present embodiment.

Figure 4:
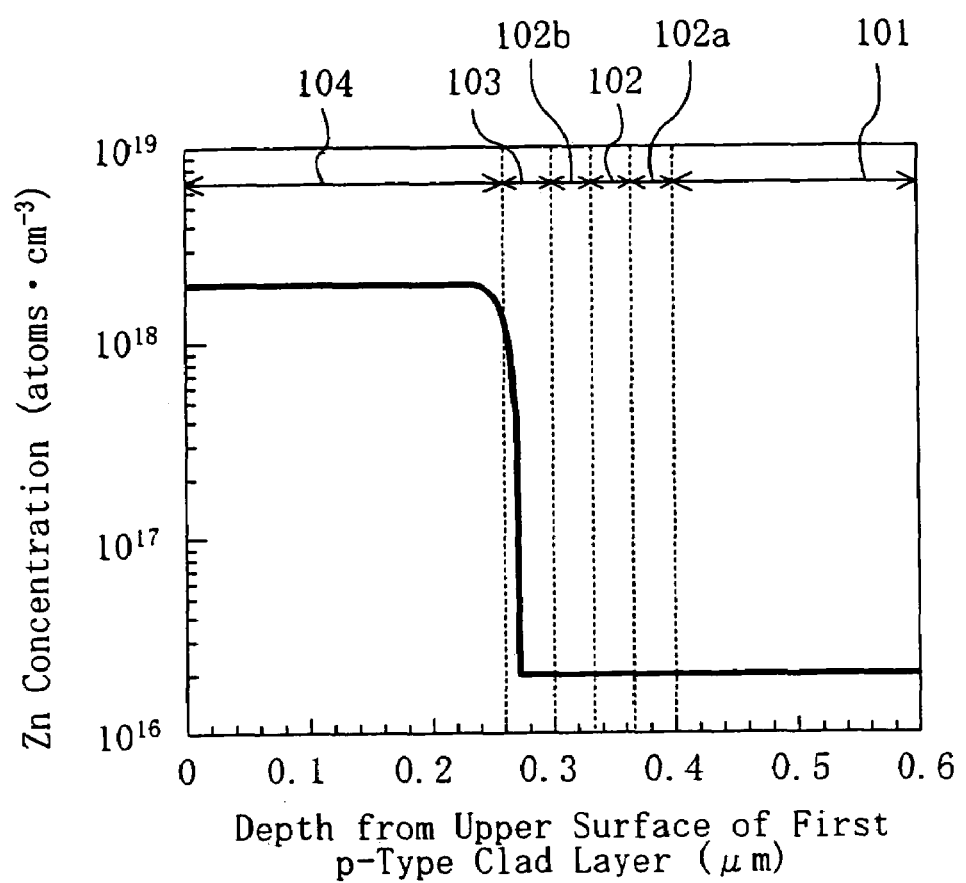
FIG. 4 shows a SIMS profile obtained from the semiconductor laser device according to EMBODIMENT 1.

FIG. 4 shows a secondary ion mass spectroscopy (hereinafter referred to as SIMS) profile obtained from the n-type clad layer 101, guide layer 102a, active layer 102, guide layer 102b, diffusion preventing layer 103, and first p-type clad layer 104 of the semiconductor laser device 10 according to the present embodiment.

Figure 3:
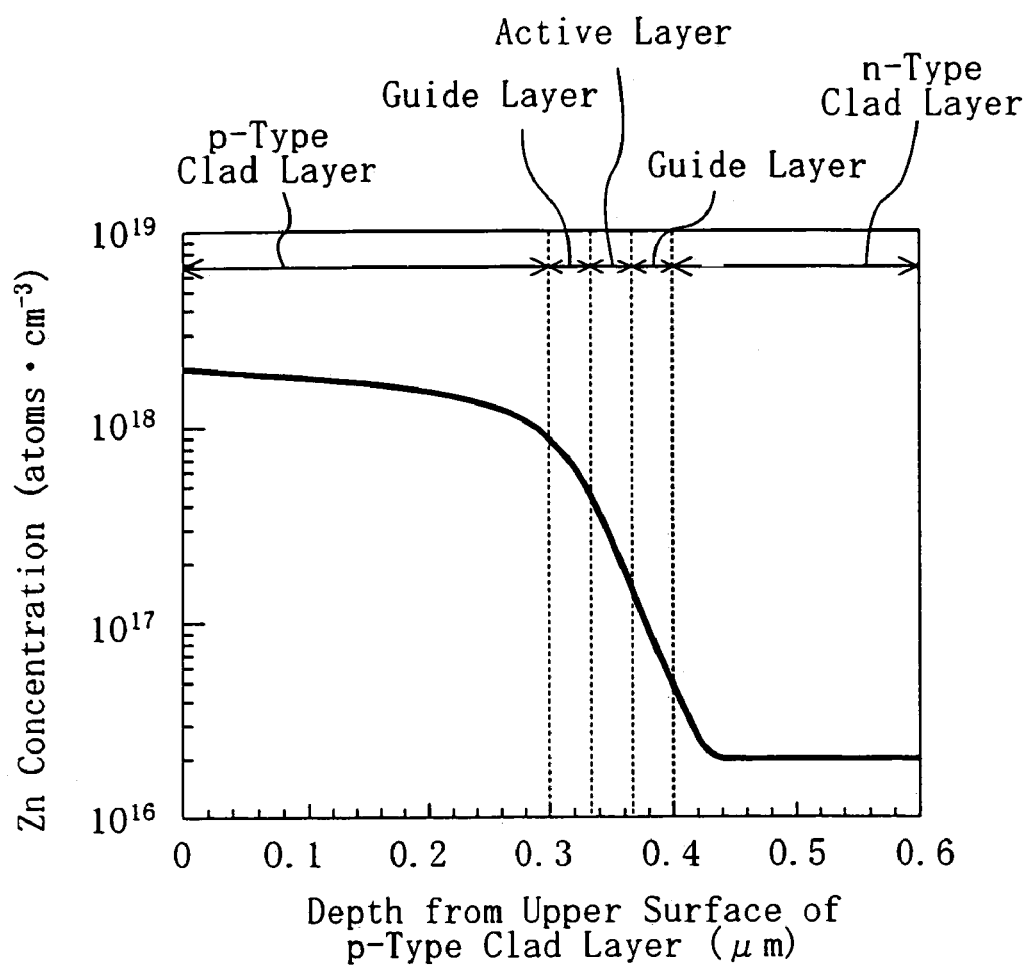
FIG. 3 shows a SIMS profile obtained from a conventional semiconductor laser device.

As can be seen from FIG. 4, the diffusion of the impurity to the active layer 102 was suppressed more effectively by the diffusion preventing layer 103 than in the conventional semiconductor laser device shown in FIG. 3 irrespective of the first p-type clad layer 104 doped with Zn at a high concentration of about $2 \times 10^{18}$ atoms cm$^{-3}$.

In the semiconductor laser device 10 according to the present embodiment, the diffusion of the p-type impurity (which is Zn in the present embodiment) from the first p-type clad layer 104 made of p-type AlGaInP, the second p-type clad layer 106 made of p-type AlGaInP, and the contact layer 107 made of p-type GaAs into the active layer 102 is not observed due to the presence of the diffusion preventing layer 103. This proves effective prevention of the diffusion of the p-type impurity into the active layer 102.

The diffusion preventing layer 103 can also suppress or prevent the diffusion of the p-type impurity from the first p-type clad layer 104 made of p-type AlGaInP, the second clad layer 106 made of p-type AlGaInP, and the contact layer 107 made of p-type GaAs even during the operation of the semiconductor laser device. This prevents the deterioration of the semiconductor laser device 10 according to the present embodiment during the operation thereof and provides the semiconductor laser device 10 with high reliability.

Although the diffusion preventing layer 103 has a particularly high diffusion preventing effect on an impurity with a high diffusion coefficient, such as Zn, which is implanted into the first p-type clad layer 104 or the like as shown in the present embodiment, the present invention is not limited thereto. A similar diffusion preventing effect is achievable if the first p-type clad layer 104 or the like is doped with an impurity such as Be, Mg, Si, or C.

Preferably, the diffusion preventing layer 103 has a thickness in the range of 2 nm to 50 nm. This allows effective suppression or prevention of impurity diffusion into the active layer 102. If the thickness of the diffusion preventing layer 103 is less than 2 nm, the p-type impurity may penetrate the diffusion preventing layer 103 to reach the active layer 102. If the thickness of the diffusion preventing layer 103 is more than 50 nm, optical distribution in a direction perpendicular to the substrate is greatly affected thereby. This reduces a design margin for providing a desired beam configuration.

In the present embodiment, the active layer 102 is composed of the plurality of GaInP layers and the plurality of AlGaInP layers. If consideration is given to the ratio between the contents of elements, the active layer 102 may be made appropriately of $(Al_xGa_{1-x})_{1-y}In_yP$ ($0 \leq x \leq 1$, $0 \leq y \leq 1$) and the diffusion preventing layer 103 may be made appropriately of $Al_zGa_{1-z}As$ ($0 \leq z \leq 1$).

Preferably, the diffusion preventing layer 103 includes layers made of $Al_wGa_{1-w}As$ ($0 < w \leq 1$) and layers made of GaAs which are alternately deposited. This is because the interfaces (heterojunction interfaces) between the layers made of $Al_wGa_{1-w}As$ ($0 < w \leq 1$) and the layers made of GaAs are repeatedly observed in the resulting structure. This enhances the effect of suppressing impurity diffusion.

Although the compound semiconductor composing the diffusion preventing layer 103 is AlGaAs, it preferably contains silicon or selenium. This further enhances the effect of suppressing or preventing the diffusion of the dopant from the clad layer to the active layer.

By particularly using a compound semiconductor containing any one element of carbon, beryllium and magnesium to compose the diffusion preventing layer 103, the diffusion preventing layer 103 is allowed to have p-type conductivity. This reduces the electric resistance of the diffusion preventing layer 103 and further reduces the power consumption of the semiconductor laser device 10.

Specifically, if a compound semiconductor containing carbon is used to compose the diffusion preventing layer 103, the concentration of carbon is preferably in the range of $1 \times 10^{17}$ to $1 \times 10^{20}$ atoms cm$^{-3}$. If a compound semiconductor containing beryllium is used to compose the diffusion preventing layer 103, the concentration of beryllium is preferably in the range of $1\times10^{17}$ to $1\times10^{19}$ atoms cm$^{-3}$. If a compound semiconductor containing magnesium is used to compose the diffusion preventing layer 103, the concentration of magnesium is preferably in the range of $1\times10^{17}$ to $1\times10^{19}$ atoms cm$^{-3}$.

To form the diffusion preventing layer 103 made of the compound semiconductor containing carbon, the diffusion preventing layer 103 may be doped appropriately with carbon when it is deposited in the step shown in FIG. 2A of the fabrication method for the semiconductor laser device 10 described above. In the case of using the compound semiconductor containing beryllium or magnesium, exactly the same method may be used appropriately.

Although the thickness of the guide layer 102b made of AlGaInP has been adjusted to 30 nm in the present embodiment, the thickness of the guide layer 102b is preferably in the range of 10 nm to 50 nm. This suppresses or prevents interdiffusion of phosphorus and arsenic between the active layer 102 and the diffusion preventing layer 103. If the thickness of the guide layer 102b is less than 10 nm, the effect of preventing interdiffusion of phosphorus and arsenic between the active layer 102 and the diffusion presenting layer 103 cannot be achieved. If the thickness of the guide layer 102b is more than 50 nm, the electric resistance of the guide layer 102b is increased so that the power consumption of the semiconductor laser device 10 is increased.

In the structure of the semiconductor laser device 10 according to the present embodiment, the impurity concentration of the first p-type clad layer 104 is preferably in the range of $5\times10^{17}$ atoms cm$^{-3}$ to $1\times10^{19}$ atoms cm$^{-3}$. This suppresses the overflow of electrons and provides a red semiconductor laser device capable of performing a high-output operation at a high temperature. If the impurity concentration is less than $5\times10^{17}$ atoms cm$^{-3}$, the overflow of electrons becomes conspicuous so that an operating current is increased and a temperature characteristic is degraded. Conversely, if the impurity concentration is more than $1\times10^{19}$ atoms cm$^{-3}$, the crystalline property is degraded so that the reliability of the semiconductor laser device is lowered.

Although the present embodiment has used the n-type GaAs substrate, the present invention is not limited thereto. A p-type substrate (such as a p-type GaAs substrate) may also be used instead.

Although the present embodiment has used, as the active layer 102, an active layer having a multiple quantum well structure, the present invention is not limited thereto. For example, a single quantum well structure or a bulk active layer may also be used instead.

Although the present embodiment has used the n-type current block layer 105 made of AlGaInP and having a real-refractive index-guided structure, the present invention is not limited thereto. For example, a current block layer made of GaAs and having a complex-refractive index-guided structure may also be used instead.

Embodiment 2

Figure 5:
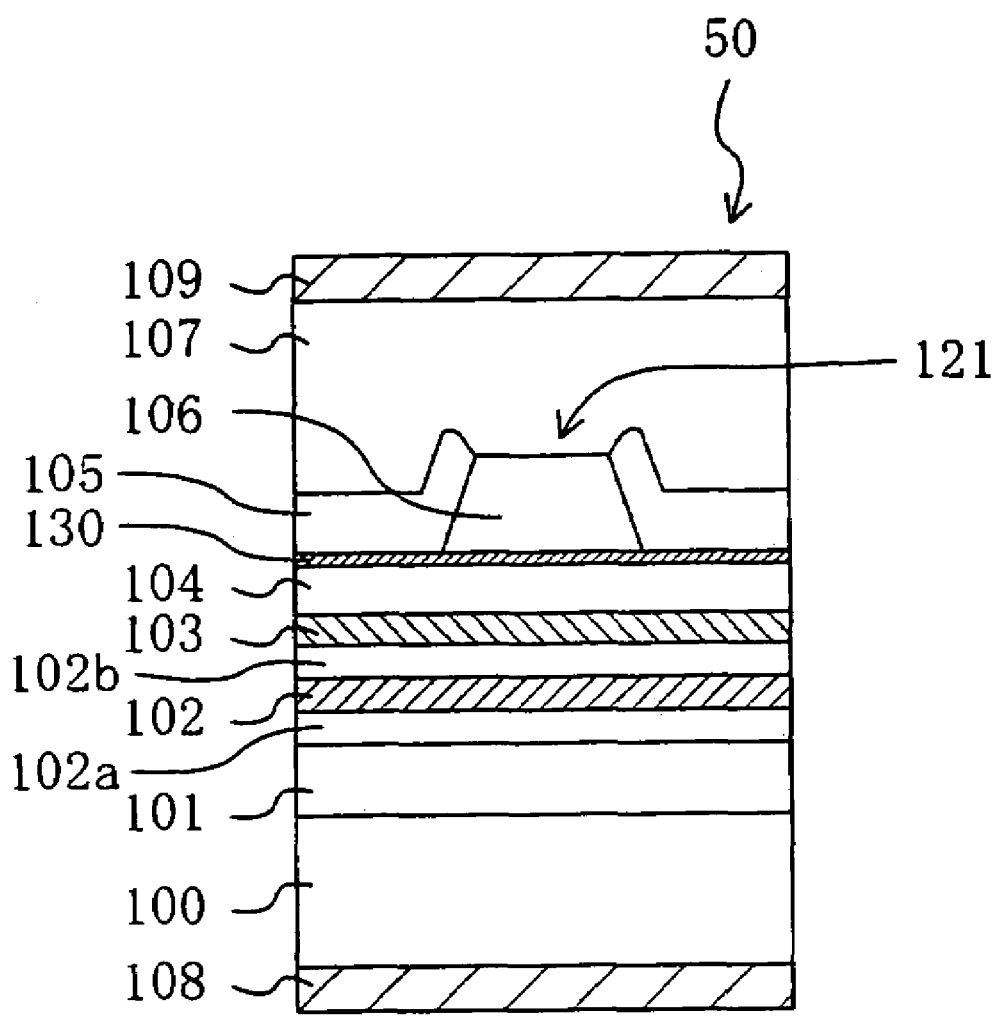
FIG. 5 is a cross-sectional view of a semiconductor laser device according to EMBODIMENT 2 of the present invention.

FIG. 5 is a cross-sectional view of a semiconductor laser device according to EMBODIMENT 2 of the present invention.

As shown in FIG. 5, a semiconductor laser device 50 according to the present embodiment has a multilayer structure composed of: an n-type clad layer 101 made of n-type AlGaInP; a guide layer 102a (with a thickness of 30 nm) made of AlGaInP; an active layer 102 composed of a quantum well consisting of a plurality of GaInP layers and a plurality of AlGaInP layers; a guide layer 102b (with a thickness of 30 nm) made of AlGaInP; a diffusion preventing layer 103 made of AlGaAs; a first p-type clad layer 104 made of p-type AlGaInP; an etching stop layer 130 made of GaInP; a current block layer 105 made of n-type AlGaInP; a second p-type clad layer 106 made of p-type AlGaInP; and a contact layer 107 made of p-type GaAs, which are stacked successively on a substrate 100 made of n-type GaAs.

In the present embodiment, the active layer 102 is composed of a repetition of the structure in which the GaInP layers are sandwiched between the AlGaInP layers.

An n-side electrode 108 made of a metal (such as an alloy of Au, Ge, or Ni) making an ohmic contact with the n-type GaAs substrate 100 is formed on the lower surface of the n-type GaAs substrate 100. A p-side electrode 109 made of a metal (such as an alloy of Cr, Pt, or Au) making an ohmic contact with the contact layer 107 is formed on the upper surface of the contact layer 107.

The current block layer 10S is formed with an opening 121 extending in a direction perpendicular to the paper plane to reach the etching-stop layer 130. Through the opening 121, the etching stop layer 130 and the second p-type clad layer 106 are in contact with each other. A current is injected through the opening 121 into the active layer 102 to cause laser oscillation.

In the present embodiment, AlGaInP represents $(Al_xGa_{1-x})_{1-y}In_yP$ ($0 \leq x \leq 1$, $0 \leq y \leq 1$) and GaInP represents a compound semiconductor obtained when x=0 is satisfied in $(Al_xGa_{1-x})_{1-y}In_yP$, while AlGaAs represents $Al_zGa_{1-z}As$ ($0 \leq z \leq 1$).

Table 2 shows the respective thicknesses, impurity concentrations, and Al composition ratios of the individual layers of the semiconductor laser device 50 according to the present embodiment.

TABLE 2

| Layer | Thickness | Impurity Concentration (atoms cm$^{-3}$) | Al Composition Ratio x |
|---|---|---|---|
| n-Type Clad Layer 101 | 1.5 μm | $1 \times 10^{18}$ | 0.7 |
| Guide Layer 102a | 30 nm | Undoped | 0.5 |
| Active Layer 102 | | | |
| GaInP Layers (3 in Total) | 6 nm | Undoped | 0 |
| AlGaInP Layers (2 in Total) | 6 nm | Undoped | 0.5 |
| Guide Layer 102b | 30 nm | Undoped | 0.5 |
| Diffusion Preventing Layer 103 | 30 nm | Undoped | 0.85 |
| First p-Type Glad Layer 104 | 0.2 μm | $1 \times 10^{18}$ | 0.7 |
| Etching Stop Layer 130 | 1 nm | $1 \times 10^{18}$ | 0 |
| Current Block Layer 105 | 0.3 μm | $1 \times 10^{18}$ | 1.0 |
| Second p-Type Clad Layer 106 | 1.5 μm | $1 \times 10^{18}$ | 0.7 |
| Contact Layer 107 | 2.0 μm | $2 \times 10^{18}$ | GaAs |

In the present embodiment, y representing the composition ratio of In has a value of about 0.5 in each of the n-type clad layer 101, the guide layer 102a, the active layer 102, the guide layer 102b, the first p-type clad layer 104, the etching stop layer 130, the current block layer 105, and the second p-type clad layer 106 each made of a material represented by $(Al_xGa_{1-x})_{1-y}In_yP$. To achieve lattice matching with the n-type GaAs substrate 100, the value of y representing the In composition ratio is preferably in the range of $0.45 \leq y \leq 0.55$. It will easily be appreciated that, if another substrate is used, the value of y may be varied appropriately depending on the substrate and the value of y is not limited to the foregoing range.

A description will be given to a method for fabricating the semiconductor laser device with reference to FIGS. 6A, 6B, 7A, and 7B. FIGS. 6A, 6B, 7A, and 7B diagrammatically show the cross-sectional structures of the semiconductor laser device according to the present embodiment in the individual steps of a fabrication process therefor.

Figure 6A:
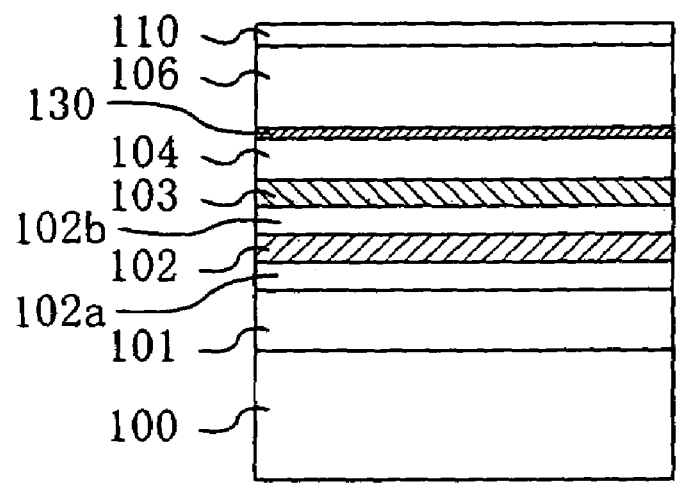
FIGS. 6A and 6B diagrammatically show the cross-sectional structures of the semiconductor laser device according to EMBODIMENT 2 in the individual steps of a fabrication process therefor.

First, in the step shown in FIG. 6A, the substrate 100 made of n-type GaAs is prepared. Then, the n-type clad layer 101 made of n-type AlGaInP, the guide layer 102a made of AlGaInP, the active layer 102, the guide layer 102b made of AlGaInP, the diffusion preventing layer 103 made of AlGaAs, the first p-type clad layer 104 made of p-type AlGaInP, the etching stop layer 130 made of GaInP, the second p-type clad layer 106 made of p-type AlGaInP, and a cap layer 110 made of GaAs are deposited successively by, e.g., MOCVD, MBE, or the like. The active layer 102 is formed by alternately depositing the GaInP layers and the AlGaInP layers.

In forming the first and second p-type clad layers 104 and 106 each made of p-type AlGaInP in the foregoing step, Zn is introduced as a p-type dopant. The introduction of Zn is effected by using a method well known to those skilled in the art, such as one which mixes $Zn(CH_3)_2$ in a raw material gas and forms an AlGaInP layer by crystal growth, one which forms an undoped AlGaInP layer and introduces Zn by ion implantation, or one which forms an undoped AlGaInP layer by crystal growth and uses ZnO as a solid-phase diffusion source to introduce Zn by solid-phase diffusion.

Figure 6B:
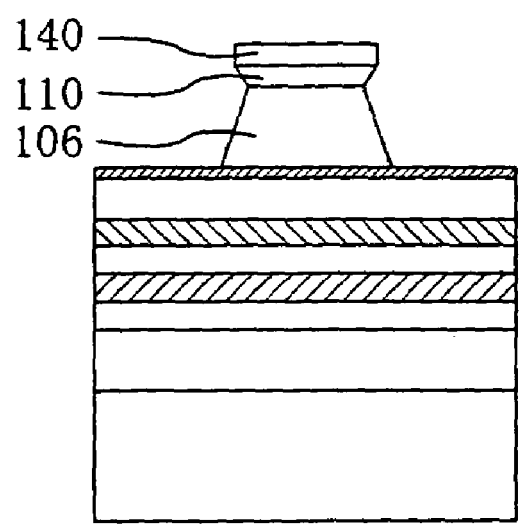

Next, in the step shown in FIG. 6B, an $SiO_2$ film is formed on the substrate obtained in the previous step. The $SiO_2$ film is further patterned by photolithography and wet etching to form an $SiO_2$ mask 140 configured as a stripe extending in a direction perpendicular to the paper plane. Subsequently, etching is performed by using the $SiO_2$ mask 140, thereby removing the second p-type clad layer 106 and the cap layer 110.

Figure 7A:
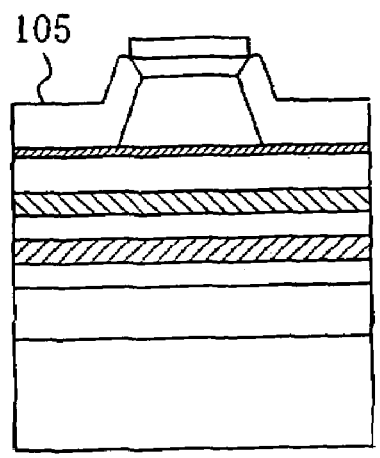
FIGS. 7A and 7B diagrammatically show the cross-sectional structures of the semiconductor laser device according to EMBODIMENT 2 in the individual steps of a fabrication process therefor.

Next, in the step shown in FIG. 7A, the current block layer 105 made of n-type AlGaInP is deposited by, e.g., MOCVD, MBE, or the like on the substrate obtained in the previous step. During the deposition, the current block layer 105 is barely deposited on the $SiO_2$ mask 140 composed of an oxide film.

Figure 7B:
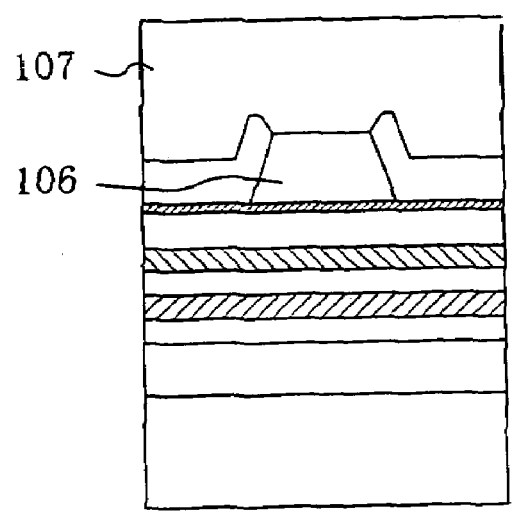

Next, in the step shown in FIG. 7B, the contact layer 107 made of p-type GaAs is deposited by, e.g., MOCVD, MBE, or the like on the substrate obtained in the previous step.

Next, the p-side electrode 109 is formed by electron beam vapor deposition or the like on the contact layer 107. Likewise, the n-side electrode 108 is formed by electron beam vapor deposition or the like on the substrate 100, whereby the semiconductor laser device 50 according to the present embodiment shown in FIG. 5 is obtained.

Since the operation of the semiconductor laser device 50 according to the present embodiment is exactly the same as that of the semiconductor laser device 10 according to EMBODIMENT 1, the description thereof will be omitted.

In the semiconductor laser device 50 according to the present embodiment, the diffusion preventing layer 103 is disposed between the guide layer 102b and the first p-type clad layer 104 in the same manner as in the semiconductor laser device 10 according to EMBODIMENT 1. This achieves exactly the same effects achieved in EMBODIMENT 1.

In the present embodiment also, the diffusion preventing layer 103, the guide layer 102b, and the first p-type clad layer 104 may have the same structures as in EMBODIMENT 1.

Although the present embodiment has used the n-type GaAs substrate, the present invention is not limited thereto. A p-type substrate (such as a p-type GaAs substrate) may also be used instead.

Although the present embodiment has used, as the active layer 102, an active layer having a multiple quantum well structure, the present invention is not limited thereto. For example, a single quantum well structure or a bulk active layer may also be used instead.

Although the present embodiment has used the n-type current block layer 105 made of AlGaInP and having a real-refractive index-guided structure, the present invention is not limited thereto. For example, a current block layer made of GaAs and having a complex-refractive index-guided structure may also be used instead.

Embodiment 3

Figure 8:
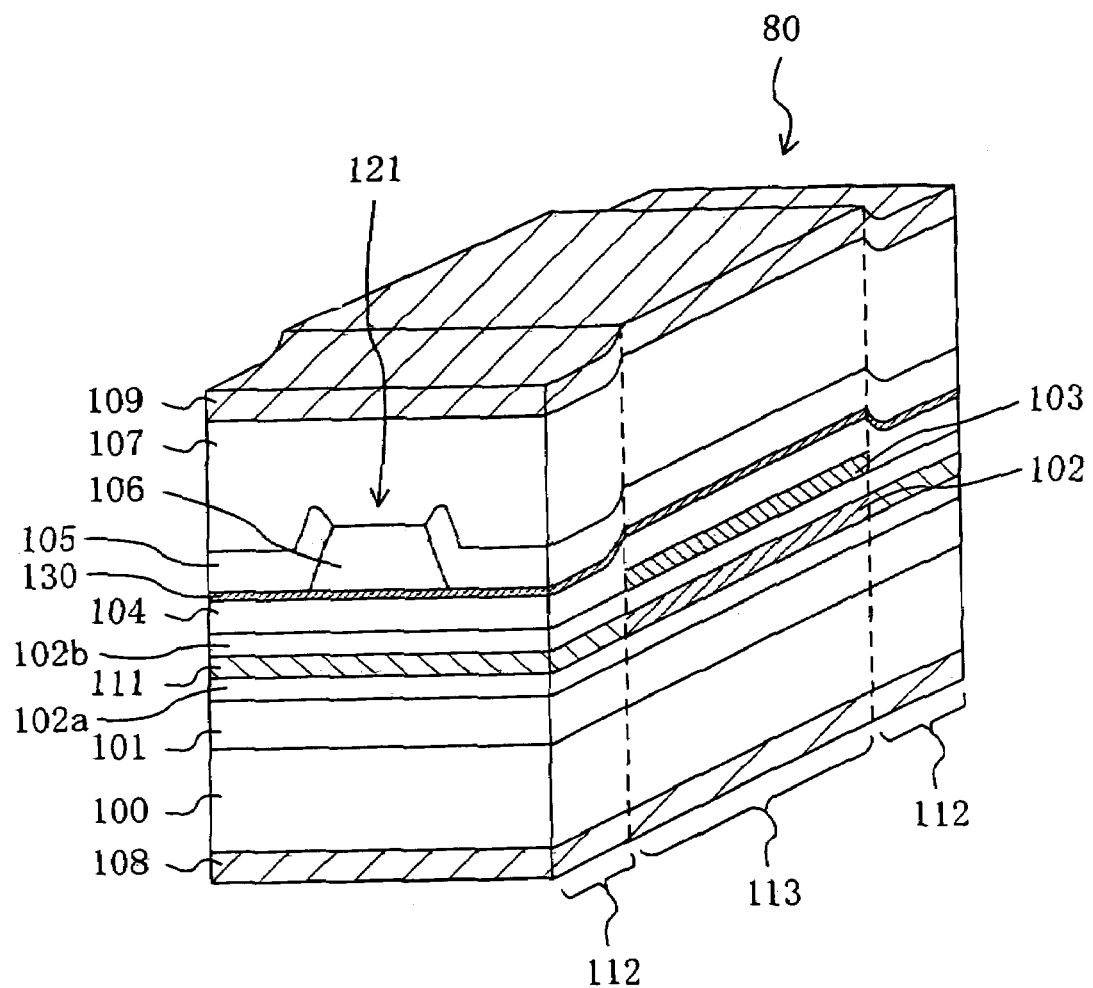
FIG. 8 is a perspective view showing a structure of a semiconductor laser device according to EMBODIMENT 3 of the present invention.

FIG. 8 is a perspective view showing a structure of a semiconductor laser device according to EMBODIMENT 3.

As shown in FIG. 8, a semiconductor laser device 80 according to the present embodiment has a structure (so-called window structure) comprising laser facet regions 112 and an internal region 113.

Each of the laser facet regions 112 has a multilayer structure composed of: an n-type clad layer 101 made of n-type AlGaInP; a guide layer 102a (with a thickness of 30 nm) made of AlGaInP; an alloyed active layer 111 made of alloyed GaInP and AlGaInP; a guide layer 102b (with a thickness of 30 nm) made of AlGaInP; a first p-type clad layer 104 made of p-type AlGaInP; an etching stop layer 130 made of GaInP; a current block layer 105 made of n-type AlGaInP; a second p-type clad layer 106 made of p-type AlGaInP; and a contact layer 107 made of p-type GaAs, which are stacked successively on a substrate 100 made of n-type GaAs.

The internal region 113 has a multilayer structure composed of: the n-type clad layer 101 made of n-type AlGaInP; the guide layer 102a (with a thickness of 30 nm) made of AlGaInP; an active layer 102 composed of a quantum well consisting of a plurality of GaInP layers and a plurality of AlGaInP layers; the guide layer 102b (with a thickness of 30 nm) made of AlGaInP; a diffusion preventing layer 103 made of AlGaAs; the first p-type clad layer 104 made of p-type AlGaInP; the etching stop layer 130 made of GaInP; the current block layer 105 made of n-type AlGaInP; the second p-type clad layer 106 made of p-type AlGaInP; and the contact layer 107 made of p-type GaAs, which are stacked successively on the substrate 100 made of n-type GaAs.

In the present embodiment, the active layer 102 is composed of a repetition of the structure in which the GaInP layers are sandwiched between the AlGaInP layers.

An n-side electrode 108 made of a metal (such as an alloy of Au, Ge, or Ni) making an ohmic contact with the n-type GaAs substrate 100 is formed on the lower surface of the n-type GaAs substrate 100. A p-side electrode 109 made of a metal (such as an alloy of Cr, Pt, or Au) making an ohmic contact with the contact layer 107 is formed on the upper surface of the contact layer 107.

The current block layer 105 is formed with an opening 120 configured as a stripe extending in a direction perpendicular to the paper plane to reach the etching stop layer 130. Through the opening 120, the etching stop layer 130 and the second p-type clad layer 106 are in contact with each other.

In the present embodiment, AlGaInP represents $(Al_xGa_{1-x})_{1-y}In_yP$ ($0 \leq x \leq 1$, $0 \leq y \leq 1$) and GaInP represents a compound semiconductor obtained when x=0 is satisfied in $(Al_xGa_{1-x})_{1-y}In_yP$, while AlGaAs represents $Al_zGa_{1-z}As$ ($0 \leq z \leq 1$).

Table 3 shows the respective thicknesses, impurity concentrations, and Al composition ratios of the individual layers of the semiconductor laser device 80 according to the present embodiment.

TABLE 3

| Layer | Thickness | Impurity Concentration (atoms cm$^{-3}$) | Al Composition Ratio x |
|---|---|---|---|
| n-Type Clad Layer 101 | 1.5 μm | 1 × 10$^{18}$ | 0.7 |
| Guide Layer 102a | 30 nm | Undoped | 0.5 |
| Active Layer 102 | | | |
| GaInP Layers (3 in Total) | 6 nm | Undoped | 0 |
| AlGaInP Layers (2 in Total) | 6 nm | Undoped | 0.5 |
| Guide Layer 102b | 30 nm | Undoped | 0.5 |
| Diffusion Preventing Layer 103 | 40 nm | Undoped | 0.85 |
| First p-Type Clad Layer 104 | 0.2 μm | 1 × 10$^{18}$ | 0.7 |
| Etching Stop Layer 130 | 1 nm | 1 × 10$^{18}$ | 0 |
| Current Block Layer 105 | 0.3 μm | 1 × 10$^{18}$ | 1.0 |
| Second p-Type Clad Layer 106 | 1.5 μm | 1 × 10$^{18}$ | 0.7 |
| Contact Layer 107 | 2.0 μm | 2 × 10$^{18}$ | GaAs |

In the present embodiment, y representing the composition ratio of In has a value of about 0.5 in each of the n-type clad layer 101, the guide layer 102a, the active layer 102, the alloyed active layer 111, the guide layer 102b, the first p-type clad layer 104, the etching stop layer 130, the current block layer 105, and the second p-type clad layer 106 each made of a material represented by $(Al_xGa_{1-x})_{1-y}In_yP$. To achieve lattice matching with the n-type GaAs substrate 100, the value of y representing the In composition ratio is preferably in the range of $0.45 \leq y \leq 0.55$. It will easily be appreciated that, if another substrate is used, the value of y may be varied appropriately depending on the substrate and the value of y is not limited to the foregoing range.

A description will be given to a method for fabricating the semiconductor laser device with reference to FIGS. 9A to 11B. FIGS. 9A to 11B are perspective views diagrammatically showing the cross-sectional structures of the semiconductor laser device according to the present embodiment in the individual steps of a fabrication process therefor.

Figure 9A:
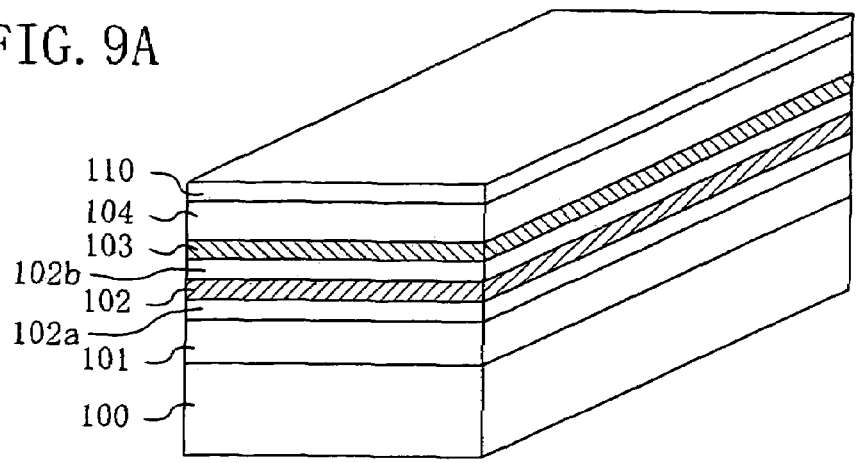
FIGS. 9A to 9C are perspective views diagrammatically showing the cross-sectional structures of the semiconductor laser device according to EMBODIMENT 3 in the individual steps of a fabrication process therefor.

First, in the step shown in FIG. 9A, the substrate 100 made of n-type GaAs is prepared. Then, the n-type clad layer 101 made of n-type AlGaInP, the guide layer 102a made of AlGaInP, the active layer 102, the guide layer 102b made of AlGaInP, the diffusion preventing layer 103 made of AlGaAs, the first p-type clad layer 104 made of p-type AlGaInP, and a cap layer 110 made of GaAs are deposited successively by, e.g., MOCVD, MBE, or the like on the substrate 100. The active layer 102 is formed by alternately depositing the GaInP layers and the AlGaInP layers.

In forming the first p-type clad layer 104 made of p-type AlGaInP in the foregoing step, Zn is introduced as a p-type dopant. The introduction of Zn is effected by using a method well known to those skilled in the art, such as one which mixes $Zn(CH_3)_2$ in a raw material gas and forms an AlGaInP layer by crystal growth, one which forms an undoped AlGaInP layer and introduces Zn by ion implantation, or one which forms an undoped AlGaInP layer by crystal growth and uses ZnO as a solid-phase diffusion source to introduce Zn by solid-phase diffusion.

Figure 9B:
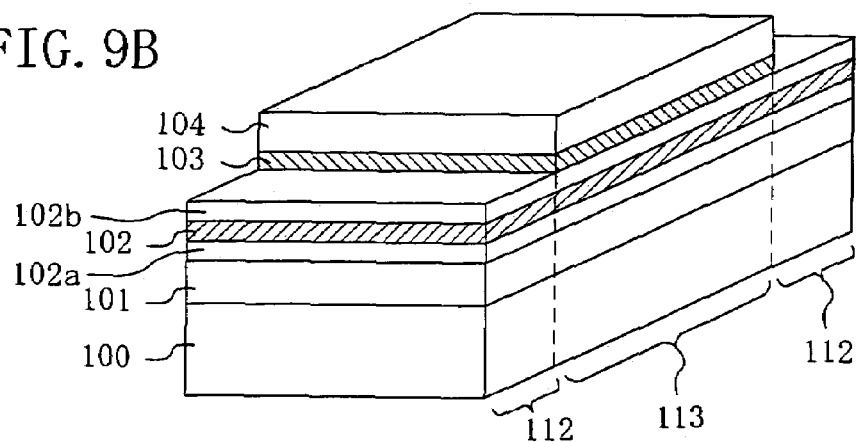

Next, in the step shown in FIG. 9B, the respective portions of the diffusion preventing layer 103 and the first p-type clad layer 104 located in the laser facet regions 112 are removed by photolithography and wet etching.

Figure 9C:
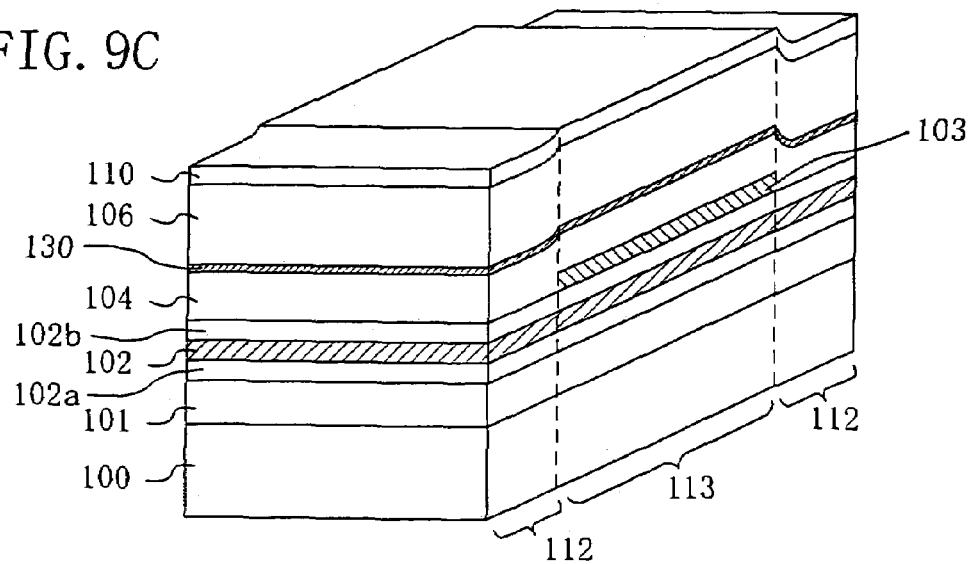

Subsequently, in the step shown in FIG. 9C, the first p-type clad layer 104 made of p-type AlGaInP, the etching stop layer 130 made of GaInP, the second p-type clad layer 106 made of p-type AlGaInP, and the cap layer 110 made of GaAs are deposited successively by, e.g., MOCVD, MBE, or the like on the substrate obtained in the previous step. In forming the second p-type clad layer 106 also, Zn is introduced as a p-type impurity. The introduction of Zn is effected by the same method as used in forming the first p-type clad layer 104 in the step shown in FIG. 9A, which is well known to those skilled in the art.

Figure 10A:
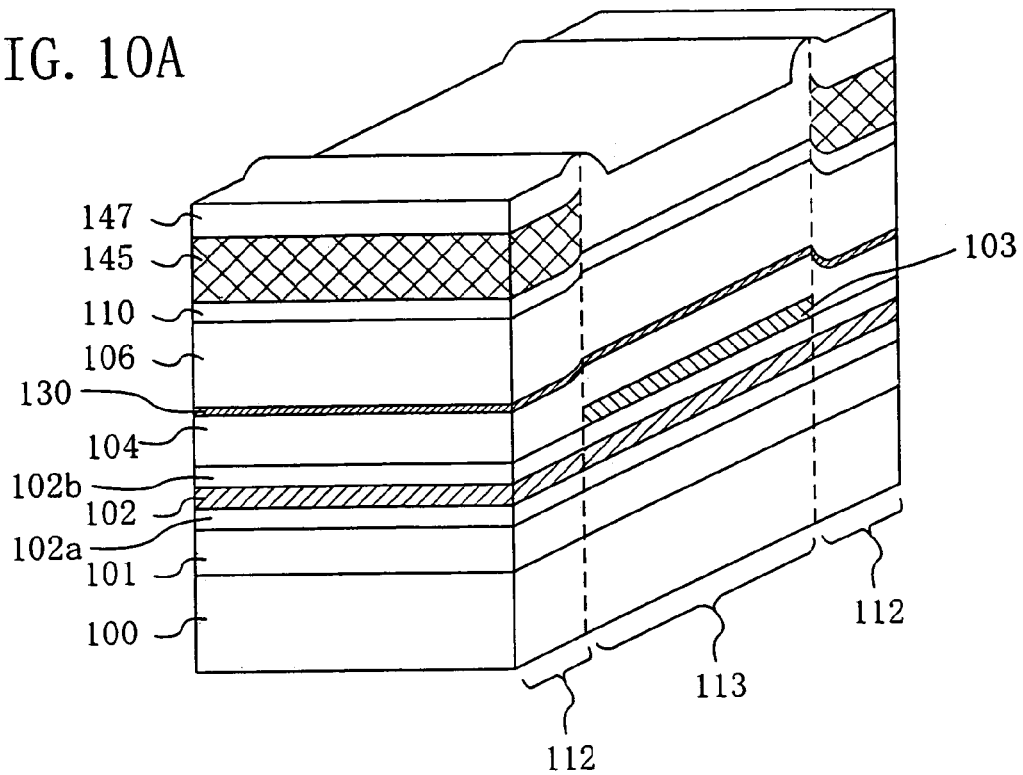
FIGS. 10A and 10B are perspective views diagrammatically showing the cross-sectional structures of the semiconductor laser device according to EMBODIMENT 3 in the individual steps of the fabrication process therefor.

Next, in the step shown in FIG. 10A, a ZnO film is deposited by sputtering or the like on the substrate obtained in the previous step. Subsequently, photolithography and wet etching is performed to remove the portion of the ZnO film located in the internal region 113, thereby forming a ZnO diffusion source 145. Then, a $SiO_2$ film 147 is deposited by, e.g., CVD on the substrate.

Figure 10B:
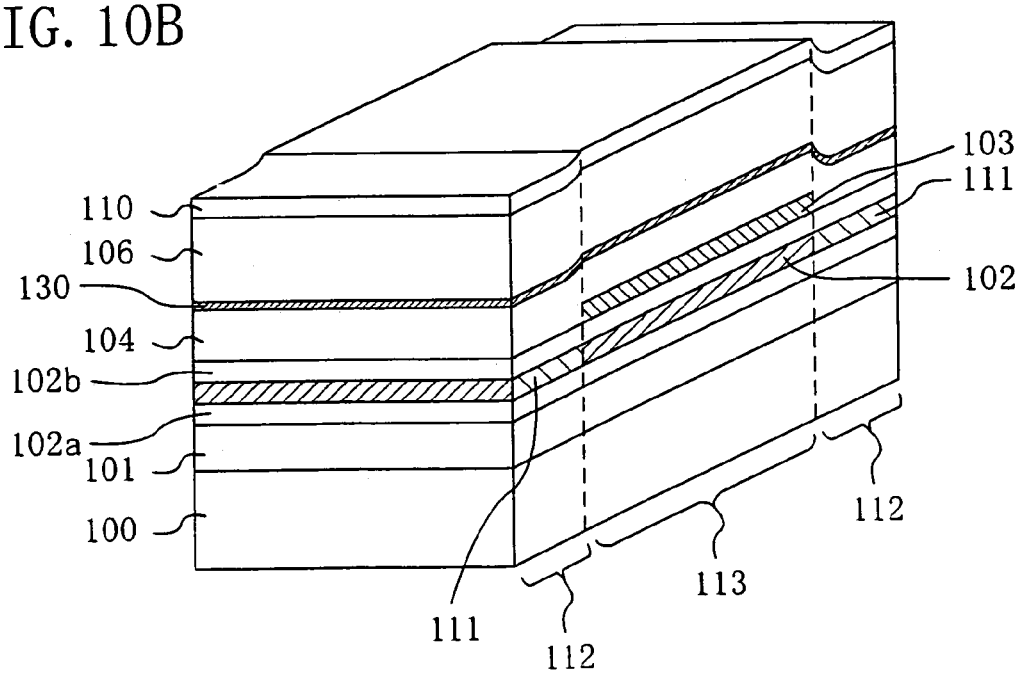

Next, in the step shown in FIG. 10B, the substrate obtained in the previous step is thermally treated such that Zn is diffused from the ZnO mask to the active layer 102 and that intersubstitution occurs between the elements of GaInP and AlGaInP composing the active layer 102 (alloying process). As a result, the alloyed active layers 111 are formed. Subsequently, the ZnO diffusion source 145 and the $SiO_2$ mask 147 are etched away.

Figure 11A:
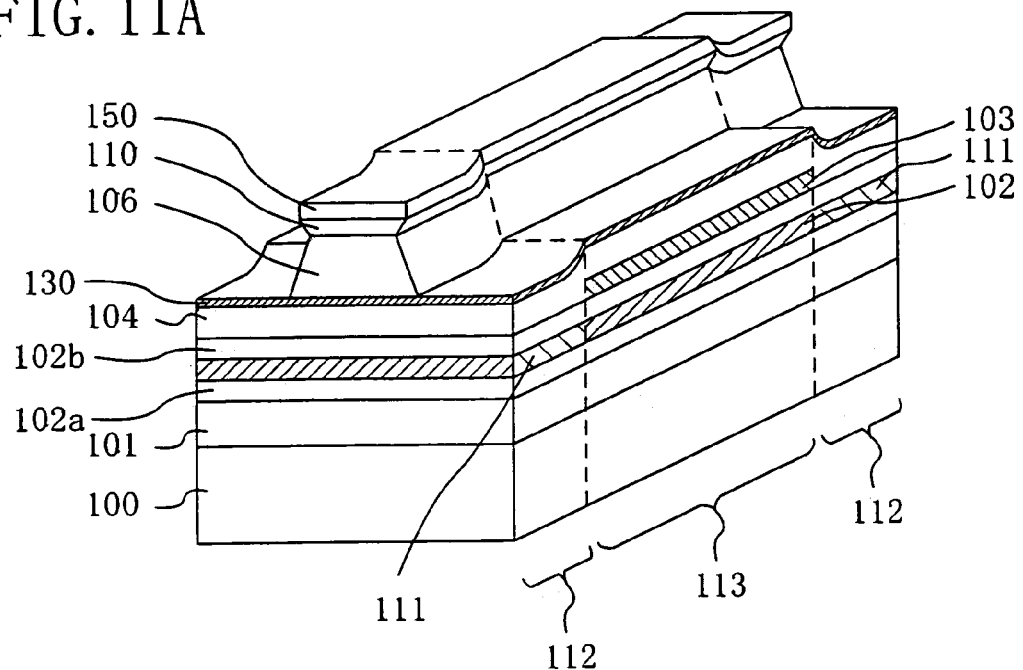
FIGS. 11A and 11B are perspective views diagrammatically showing the cross-sectional structures of the semiconductor laser device according to EMBODIMENT 3 in the individual steps of the fabrication process therefor.

Then, in the step shown in FIG. 11A, an $SiO_2$ film is formed on the substrate obtained in the previous step. The $SiO_2$ film is further patterned by photolithography and wet etching to form an $SiO_2$ mask 150 configured as a stripe extending crosswise over the laser facet regions 112 and the internal region 113. Subsequently, etching is performed by using the $SiO_2$ mask 150, thereby removing the second p-type clad layer 106 and the cap layer 110.

Figure 11B:
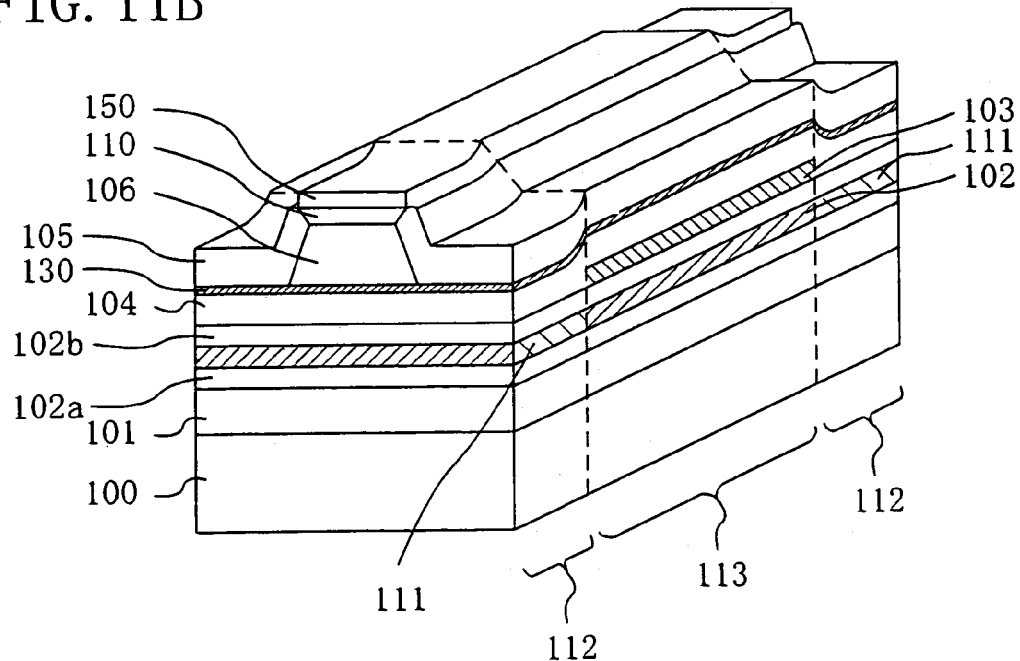

Next, in the step shown in FIG. 11B, the current block layer 105 made of n-type AlGaInP is deposited by, e.g., MOCVD, MBE, or the like on the substrate obtained in the previous step. During the deposition, the current block layer 105 is barely deposited on the $SiO_2$ mask 150 composed of an oxide film. Subsequently, the $SiO_2$ mask 150 and the cap layer 110 are etched away.

Next, the contact layer 107 made of p-type GaAs is deposited by, e.g., MOCVD, MBE, or the like on the substrate obtained in the previous step. In forming the contact layer 107 made of p-type GaAs, Zn is introduced as a p-type impurity. The introduction of Zn is effected by the same method as used in forming the first p-type clad layer 104 in the step shown in FIG. 9A, which is well known to those skilled in the art.

Subsequently, the p-side electrode 109 is formed by electron beam vapor deposition or the like on the contact layer 107. Likewise, the n-side electrode 108 is formed by electron beam vapor deposition or the like on the substrate 100, whereby the semiconductor laser device 80 according to the present embodiment shown in FIG. 8 is obtained.

Since the operation of the semiconductor laser device 80 according to the present embodiment is exactly the same as that of the semiconductor laser device 10 according to EMBODIMENT 1, the description thereof will be omitted.

In the semiconductor laser device 80 according to the present embodiment, the diffusion preventing layer 103 is disposed between the guide layer 102b and the first p-type clad layer 104 in the same manner as in the semiconductor laser devices 10 and 50 according to EMBODIMENTS 1 and 2. This achieves exactly the same effects achieved in EMBODIMENT 1.

In the present embodiment also, the diffusion preventing layer 103, the guide layer 102b, and the first p-type clad layer 104 may have the same structures as in EMBODIMENT 1.

Although the present embodiment has used the n-type GaAs substrate, the present invention is not limited thereto. A p-type substrate (such as a p-type GaAs substrate) may also be used instead.

Although the present embodiment has used, as the active layer 102, an active layer having a multiple quantum well structure, the present invention is not limited thereto. For example, an active layer having a single quantum well structure or a bulk quantum well structure may also be used instead.

Although the present embodiment has used the n-type current block layer 105 made of AlGaInP and having a real-refractive index-guided structure, the present invention is not limited thereto. For example, a current block layer made of GaAs and having a complex-refractive index-guided structure may also be used instead.

As shown in FIG. 8, the semiconductor laser device 80 according to the present embodiment has a so-called window structure in which the active layer in each of the laser facet regions 112 is alloyed. The alloyed active layer 111 has a band gap larger that that of the active layer 102 in the internal region 113 so that the absorption of a light beam is suppressed in each of the laser facet regions 112. In the semiconductor laser device 80 according to the present embodiment, therefore, the level at which damage to the laser facet occurs is increased and the degradation of the internal structure thereof during a long-time operation is minimized. Thus, the present embodiment provides a semiconductor laser device with high reliability.

In the semiconductor laser device 80 according to the present embodiment, the portion of the current block layer 105 located in each of the laser facet regions 112 is formed with an opening 121, as shown in FIG. 8. Moreover, Zn diffused in each of the laser facet regions 112 has lowered the resistance of the entire laser facet region 112. As a result, a leakage current which does not contribute to laser oscillation may flow in the laser facet region 112 through the opening 121.

To prevent this, there may be adopted a structure in which the opening 121 is not formed in either of the portions of the current block layer 105 located in the laser facet regions 112, i.e., only the portions of the current block layer 105 located in the laser facet regions 112 are formed to cover up the second p-type clad layer 106. A description will be given to the structure.

Figure 12A:
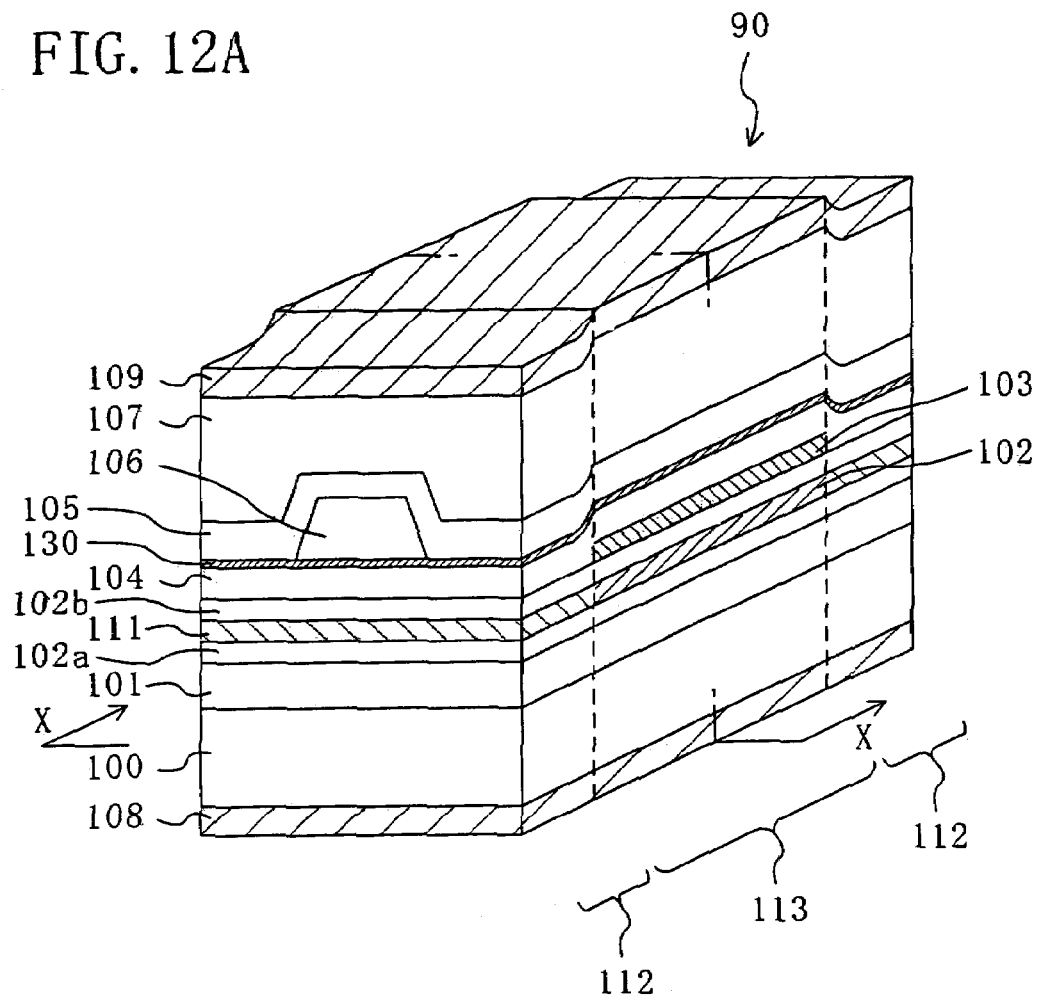
FIG. 12A is a perspective view showing a structure of a semiconductor laser device and FIG. 12B is a cross-sectional view taken along the line X-X shown in FIG. 12A.
Figure 12B:
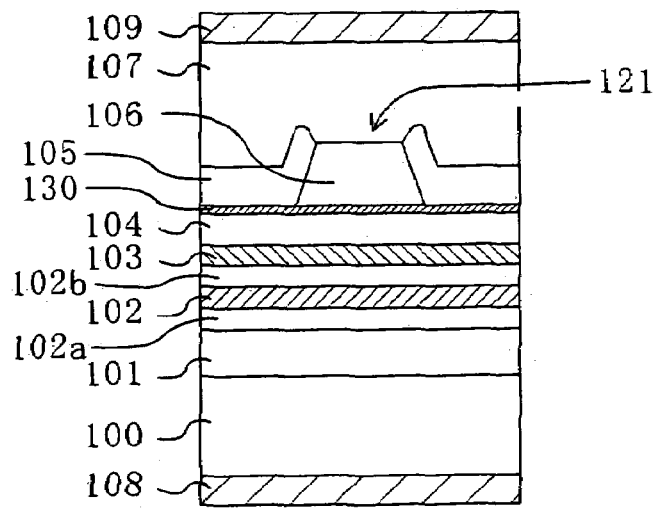

FIG. 12A is a perspective view showing a structure of a semiconductor laser device 90. FIG. 12B is a cross-sectional view taken along the line X-X shown in FIG. 12A.

As shown in FIG. 12A, the semiconductor laser device 90 has nearly the same structure as the semiconductor laser device 80. As shown in FIG. 12B, the internal structure of the semiconductor laser device 90 is exactly the same as that of the semiconductor laser device 80 so that the current block layer 105 is formed with the opening 121. As shown in FIG. 12A, the semiconductor laser device 90 is different from the semiconductor laser device 80 in that only the portions of the current block layer 105 located in the laser facet regions 112 are formed to cover up the second p-type clad layer 106.

Since the portions of the current block layer 105 located in the laser facet regions 112 are formed to cover up the second p-type clad layer 106, a leakage current is prevented from flowing in the laser facet regions 112.

A method for fabricating the semiconductor laser device 90 is nearly the same as the method for fabricating the semiconductor laser device 80 except in that the portions of the cap layer 110 and the $SiO_2$ mask 150 located in the laser facet regions 112 are removed immediately before the step shown in FIG. 11B.

If the portions of the cap layer 110 and the $SiO_2$ mask 150 located in the laser facet regions 112 are removed immediately before the step shown in FIG. 11B, the portions of the current block layer 105 located in the laser facet regions 112 are formed to cover up the second p-type clad layer 106.

As stated previously, the present invention provides a semiconductor laser device capable of performing a high-output operation at a high temperature with high reliability.

What is claimed is:

1. A method for fabricating a semiconductor laser device, the method comprising the steps of:
   (a) successively depositing, on a semiconductor substrate, an active layer made of a compound semiconductor containing phosphorus and a guide layer made of a compound semiconductor;
   (b) after the step (a), depositing, on the substrate, a dopant diffusion preventing layer made of a compound semiconductor containing arsenic; and
   (c) after the step (b), depositing, on the substrate, a first clad layer made of a compound semiconductor containing a dopant;
   (d) after the step (c), depositing, on the substrate, a current block layer made of a compound semiconductor;
   (e) forming an opening configured as a stripe in the current block layer; and (f) depositing, on the substrate, a second clad layer made of a compound semiconductor containing a dopant.

2. A method for fabricating a semiconductor laser device, the method comprising the steps of:
   (a) successively depositing, on a semiconductor substrate, an active layer made of a compound semiconductor containing phosphorus and a guide layer made of a compound semiconductor;
   (b) depositing, on the substrate, a dopant diffusion preventing layer made of a compound semiconductor containing arsenic;
   (c) depositing, on the substrate, a first clad layer made of a compound semiconductor containing a dopant;
   (d) after the step (c), successively depositing, on the substrate, an etching stop layer, a second clad layer made of a compound semiconductor containing a dopant, and a cap layer;
   (g) forming, on the cap layer, a mask having an opening;
   (h) removing, by using the mask, respective regions of the second clad layer and the cap layer located within the opening to expose the etching stop layer in the opening; and
   (i) forming, on the substrate, a current block layer made of a compound semiconductor.

3. A method for fabricating a semiconductor laser device, the method comprising the steps of:
   (a) successively depositing, on a semiconductor substrate, an active layer made of a compound semiconductor containing phosphorus and a guide layer made of a compound semiconductor;
   (b) depositing, on the substrate, a dopant diffusion preventing layer made of a compound semiconductor containing arsenic;

(c) depositing, on the substrate, a first clad layer made of a compound semiconductor containing a dopant;
(k) after the step (c), forming, on the substrate, a first mask having a first opening;
(l) forming, by using the first mask, a first region from which the respective regions of the dopant diffusion preventing layer and the first clad layer located within the first opening have been removed and a second region in which the dopant diffusion preventing layer and the first clad layer are deposited;
(m) depositing, on the substrate, the first clad layer again and further successively depositing an etching stop layer, a second clad layer made of a compound semiconductor containing a dopant, and a cap layer;
(n) forming a mask for dopant diffusion on the second region of the substrate and performing a thermal treatment;
(o) removing the mask for dopant diffusion and then forming a second mask having an opening extending crosswise over the first and second regions of the substrate;
(p) removing, by using the second mask, the regions of the second clad layer and the cap layer located within the second opening to expose the etching stop layer in the second opening; and
(q) forming, on the substrate, a current block layer made of a compound semiconductor.

* * * * *